(12) United States Patent
Tuncer

(10) Patent No.: US 11,881,461 B2
(45) Date of Patent: Jan. 23, 2024

(54) ELECTRIC FIELD CONTROL FOR BOND PADS IN SEMICONDUCTOR DEVICE PACKAGE

(71) Applicant: Texas Instruments Incorporated, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 146 days.

(21) Appl. No.: 17/491,522

(22) Filed: Sep. 30, 2021

(65) Prior Publication Data

US 2023/0097816 A1    Mar. 30, 2023

(51) Int. Cl.
*H01L 23/60* (2006.01)
*H01L 23/00* (2006.01)

(52) U.S. Cl.
CPC .............. *H01L 23/60* (2013.01); *H01L 24/05* (2013.01); *H01L 2224/0401* (2013.01); *H01L 2224/05553* (2013.01); *H01L 2224/05624* (2013.01); *H01L 2224/05644* (2013.01); *H01L 2224/05647* (2013.01)

(58) Field of Classification Search
CPC . H01L 23/60; H01L 24/05; H01L 2224/0401; H01L 2224/05553; H01L 2224/05624; H01L 2224/05644; H01L 2224/05647
See application file for complete search history.

(56) References Cited

U.S. PATENT DOCUMENTS

| 2009/0162975 A1* | 6/2009 | Honer | H01L 24/49 257/E21.002 |
| 2009/0183910 A1* | 7/2009 | Sunohara | H01L 23/50 174/266 |
| 2012/0049359 A1* | 3/2012 | Fan | H01L 23/50 257/738 |
| 2022/0199546 A1* | 6/2022 | Elsherbini | H01L 23/552 |

* cited by examiner

*Primary Examiner* — Douglas W Owens
(74) *Attorney, Agent, or Firm* — Dawn Jos; Frank D. Cimino

(57) ABSTRACT

In a described example, an apparatus includes: a semiconductor die having bond pads on a device side surface, the semiconductor die having a ground plane spaced from the bond pads by a spacing distance. The bond pads have an upper surface for receiving a ball bond, and an outer boundary, the bond pads having vertical sides extending from the upper surface to a bottom surface, the bottom surface formed over the device side surface of the semiconductor die. A protective overcoat (PO) is formed overlying the ground plane and overlying the vertical sides of the bond pads, and overlying a portion of the upper surface of the bond pads, and having an opening exposing the remaining portion of the upper surface of the bond pads, the protective overcoat having a dielectric constant of less than 3.8.

17 Claims, 14 Drawing Sheets

ELECTRIC FIELD CONTROL FOR BOND PADS IN SEMICONDUCTOR DEVICE PACKAGE

TECHNICAL FIELD

This relates generally to packaging electronic devices, and more particularly to dies in wire bonded device packages.

BACKGROUND

Processes for producing packaged electronic devices include mounting electronic devices to a package substrate, and covering the electronic devices with mold compound to form packaged devices. Semiconductor dies are produced on a semiconductor wafer in an array of devices in rows and columns, separated by scribe lines. After the semiconductor dies are completed in a wafer fabrication facility, the semiconductor dies are separated by cutting through the wafer. The semiconductor dies are then packaged in a packaging operation.

After the devices are separated from the semiconductor wafer, the semiconductor dies are mounted to a package substrate using a die attach material. In one approach, wire bonding is used to couple the semiconductor dies to the package substrate. A wire bonder tool forms bond wires between bond pads on the semiconductor die and a conductive portion of a lead on the package substrate. To increase production and reduce costs, multiple devices can be mounted to a package substrate panel that includes an array of unit devices in rows and columns. Once the wire bonding process is complete, the devices and the package substrate panel can be covered with mold compound to form packaged devices. The packaged devices can then be separated by sawing apart the molded device packages between the unit devices. Leaded packages such as small outline transistor (SOT) and small outline integrated circuit (SOIC) packages can be formed. No lead packages such as quad flat no lead (QFN) can be formed. QFN packages are increasingly used, because mounting a QFN package so a system board requires less board area.

Prior to removing the semiconductor dies from the semiconductor wafer, wafer probe testing is performed to verify that the semiconductor dies are functioning. To perform wafer probe tests, a probe station brings fine needles into contact with bond pads on the semiconductor die. The probe station applies voltages and signals to the semiconductor dies, and receives measurements and signals back, and can run various tests including stress tests on the semiconductor dies. Semiconductor dies that fail the tests are marked so that when the wafer is cut apart, the bad devices can be removed for analysis or scrapping, only known good dies (KGDs) are processed further.

For high power semiconductor dies such as power field effect transistors (power FETs) that are capable of carrying high voltages of hundreds or more volts, during wafer probe tests a high voltage will be applied to a bond pad. In some cases, arcing can occur between the bond pad or probe needle and a ground trace nearby. Arcing occurs when the electric field between the points exceeds the dielectric breakdown of air. The arc event can damage the device and result in a scrapped device, increasing costs by reducing yield. Robust and reliable semiconductor devices are needed.

SUMMARY

In a described example, an apparatus includes: a semiconductor die having bond pads on a device side surface, the semiconductor die having a ground plane spaced from the bond pads by a spacing distance. The bond pads have an upper surface for receiving a ball bond, and an outer boundary, the bond pads having vertical sides extending from the upper surface to a bottom surface, the bottom surface formed over the device side surface of the semiconductor die. A protective overcoat (PO) is formed overlying the ground plane and overlying the vertical sides of the bond pads, and overlying a portion of the upper surface of the bond pads, and having an opening exposing the remaining portion of the upper surface of the bond pads, the protective overcoat having a dielectric constant of less than 3.8.

DETAILED DESCRIPTION

Figure 1:
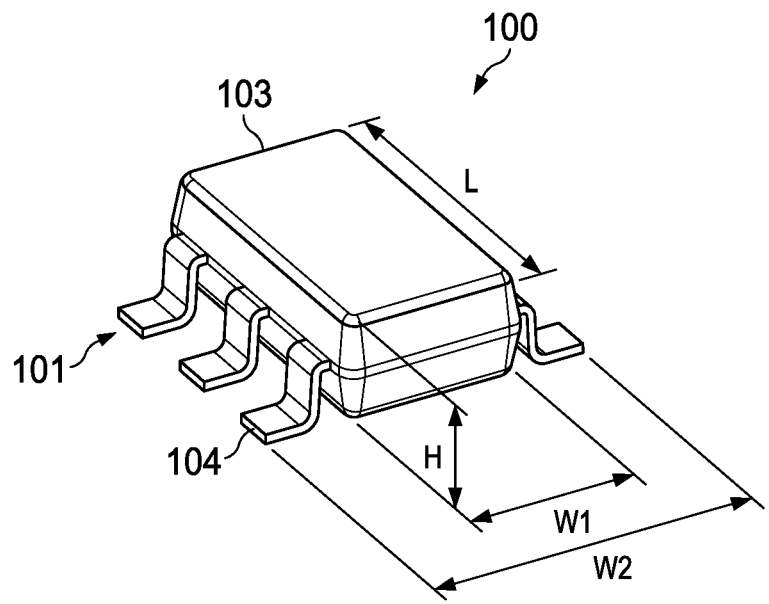
FIG. 1 illustrates, in a projection view, a leaded semiconductor device package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. A semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micro electro-mechanical system (MEMS) device, such as a digital micromirror device (DMD).

The term "semiconductor device package" is used herein. A semiconductor device package has at least one semiconductor die electrically coupled to terminals and has a package body that protects and covers the semiconductor die. In some arrangements, multiple semiconductor dies can be packaged together. For example, a power metal oxide semiconductor (MOS) field effect transistor (FET) semiconductor die and a logic semiconductor die (such as a gate driver die or a controller die) can be packaged together to from a single semiconductor device package. Additional components such as passives can be included in the semiconductor device package. The semiconductor die is mounted to a package substrate that provides conductive leads, a portion of the conductive leads form the terminals for the packaged electronic device. In the arrangements, the leads extend from a package body formed by a mold compound, and thus form a leaded semiconductor device package. The semiconductor die can be mounted to the package substrate with an active device surface facing away from the package substrate and a backside surface facing and mounted to the package substrate. The semiconductor die can be mounted on either the board side, or an opposite side, of the package substrate, that is the semiconductor die can be mounted "face up" with an active surface facing away from a board side of the package, or "face down" with the active surface facing a board side of the package.

A semiconductor device package can have a package body formed by a thermoset epoxy resin in a molding process, or by the use of epoxy, plastics, or resins that are liquid at room temperature and are subsequently cured. The package body may provide a hermetic package for the semiconductor die or dies. The package body may be formed in a mold using an encapsulation process, however, a portion of the leads of the package substrate are not covered during encapsulation, these exposed lead portions provide terminals for the leaded semiconductor device package.

The term "package substrate" is used herein. A package substrate is a substrate arranged to receive a semiconductor die and to support the semiconductor die in a completed semiconductor package. Package substrates useful with the arrangements include conductive lead frames, which can be formed from copper, aluminum, stainless steel, alloys such as Alloy 42, and copper alloys. The lead frames can include a die pad for mounting a semiconductor die, and conductive leads arranged spaced from the die pad for coupling to bond pads on the semiconductor die using wire bonds, ribbon bonds, or other conductors. Lead frames can be provided in strips or arrays. Semiconductor dies can be placed on the strips or arrays, the dies placed on a die pad for each packaged device, and die attach or die adhesive can be used to mount the dies to the die pads. In wire bonded packages, wire bonds can couple bond pads on the semiconductor dies to the leads of the lead frames. After the wire bonds are in place, a portion of the substrate, the die, and at least a portion of the die pad can be covered with a protective material such as a mold compound. In a trim and form process, tools are used to remove material and to shape the leads into a desired shape, where the lead frame leads are completed by removing support structures used during the molding process, and removing other excess lead frame material, and the leads are then shaped in a forming machine, bending the leads to a desired lead shape. Once the packages are complete, a saw can separate the packaged devices from one another by cutting through the mold compound and package substrate material between the semiconductor device packages in saw streets.

A package substrate, such as a lead frame, will have conductive portions on a die side surface. Leads of a metal lead frame are conductive all along the surfaces, while for other package substrate types, conductive lands in dielectric substrate material are arranged and aligned to electrically and mechanically connect to the bond wires used in a leaded package. Electrical connections are made to the leads from a semiconductor die bond pad. The electrical connections can be made using bond wires. Bond wires useful in the arrangements can be of any type used for semiconductor devices, including gold, copper, silver, aluminum, and coated copper bond wire such as palladium coated copper (PCC) bond wire. In alternative arrangements, ribbon bond connections can be used to make the electrical connections.

In forming semiconductor device packages, a mold compound may be used to partially cover a package substrate, to cover the semiconductor die, and to cover the electrical connections from the semiconductor die to the package substrate. This can be referred to as an "encapsulation" process, although some portions of the package substrates are not covered in the mold compound during encapsulation, for example terminals and leads are exposed from the mold compound. Encapsulation is often a compressive molding process, where thermoset mold compound such as resin epoxy can be used. A room temperature solid or powder mold compound can be heated to a liquid state, and then molding can be performed. Transfer molding can be used. Unit molds shaped to surround an individual device may be used, or block molding may be used, to form the packages simultaneously for several devices from mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the packaged devices. Portions of the package substrate form leads exposed from the mold compound package to form terminals for the packaged semiconductor device.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This cutting process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and so the saw will traverse the molded electronic devices in two different directions to cut apart the packaged electronic devices from one another in the array.

The term "bond pad" is used herein. A bond pad is a conductive pad formed on a device side surface of a semiconductor die. In the arrangements, the bond pads are used for wire bond connections, and the bond pads have an upper surface that is arranged to receive a ball bond. The upper surface of the bond pad extends to an outer boundary, the bond pad has vertical sides extending between the upper surface and a bottom surface formed over a semiconductor substrate. In example arrangements, the bond pads are aluminum. In example arrangements, the bond pads are formed in a top metal layer of a metallization structure overlying a semiconductor substrate. The bond pads may be formed of aluminum, copper, gold, or other conductors. Additional plating layers such as gold, nickel, tin, palladium may be used to increase bond reliability.

Various semiconductor device packages can be used with the arrangements. In leaded packages, the leads extend away from the package body and are shaped to form a portion for soldering to a board. Gull wing lead packages such as small outline transistor (SOT) packages can be used. A dual in line package (DIP) can be used with the arrangements. A small outline package (SOP) can be used with the arrangements. Small outline integrated circuit (SOIC) packages can be used, and small outline J-lead (SOJ) leaded semiconductor device packages can be used with the arrangements. In no lead packages, the package substrate has terminals that lie within the outside surface of the package body, and which form conductive surfaces for surface mounting to a board. QFN packages, small outline no lead (SON) packages, and other no lead packages can be used with the arrangements.

In example arrangements, materials with low k dielectric constants are used surrounding bond pads to reduce electric field strength between the outer surface of the bond pads and a nearby ground plane. By reducing the electric field strength and removing hot spots areas, arcing between the bond pads and the ground plane can be reduced. In further example arrangements, floating conductive traces are placed near the outside edges of bond pads, and between the bond pads and a ground trace or plane. Use of the floating traces reduce the arc events that occur between the ground plane and the bond pad. In still further example arrangements, an iterative design approach is used to model and modify the shape of a bond pad. The electric field strength is simulated and the shape of the bond pad is iteratively changes using an algorithm. For each change, the electric field properties are analyzed. When the electric field strength in an area of interest is below a predetermined threshold, the bond pad design is complete and the last shape is used for the bond pad shape. In another approach, the algorithm continues in an iterative manner until no further changes in the bond shape result in better performance, and then the last bond pad shape is selected as the bond pad shape. The arrangements provide multiple features for controlling the electric field around the bond pads, such as input/output pads (I/O pads) for a semiconductor device. The arrangements can be used separately or can be combined to further improve performance. Use of the arrangements reduces arcing during wafer probe test and in device use, and eliminates or reduces device failures that result. The changes to the bond pad shape are compatible with existing layout and processes, and do not greatly increase the area of the bond pad, the processes used in the arrangements do not require retooling or large modification of production flows, use of the arrangements is therefore cost effective.

FIG. 1 illustrates in a projection view a packaged electronic device 100 in a small outline transistor (SOT) package. SOT packages are used for low terminal count devices such as passive components, transistors, power and analog circuits. The leaded semiconductor device package 100 has a package body formed from a mold compound 103, such as thermoset epoxy resin. Other mold compounds, such as resins, epoxies, or plastics can be used. Fillers can be used to increase thermal performance of the molded package. Leads 101 are part of a package substrate (not visible in FIG. 1) that supports a semiconductor die (not visible in FIG. 1, as it is obscured by the package body) within 100. Portions of the leads 101 are exposed from the mold compound 103 and form electrical terminals for the leaded semiconductor device package. The leads 101 extend along the package body and form feet portions 104 at a point beneath the package body so that the leaded semiconductor device package 100 can be mounted to a circuit board or module using surface mount technology (SMT). The leads are bent first at a point just outside the outer surface of the mold compound, to shape the leads so the leads extend alongside the package 100 towards a board side of the package. The leads then are bent again at a point near the bottom of the package body (as oriented in FIG. 1) to form feet portions 104 at the distal ends of the leads for use in surface mounting the package 100 to a board. Leads 101 are gull-wing leads. Package sizes for packaged electronic devices are continually decreasing, and currently can be several millimeters on a side to less than one millimeter on a side, although larger and smaller sizes are also used. Future package sizes may be smaller. A JEDEC standard for a 6 terminal SOT package, as an example package that is useful with the arrangements, is the SOT-23-6 package. An example of a SOT package has a body length L that is about 3 millimeters, and a package body width W1 about 1.75 millimeters, and the total package width W2 (including the leads extended to the ends of the leads) is about 3 millimeters. The package body has a height H of about 1.45 millimeters including the ends of the leads 101.

Figure 2:
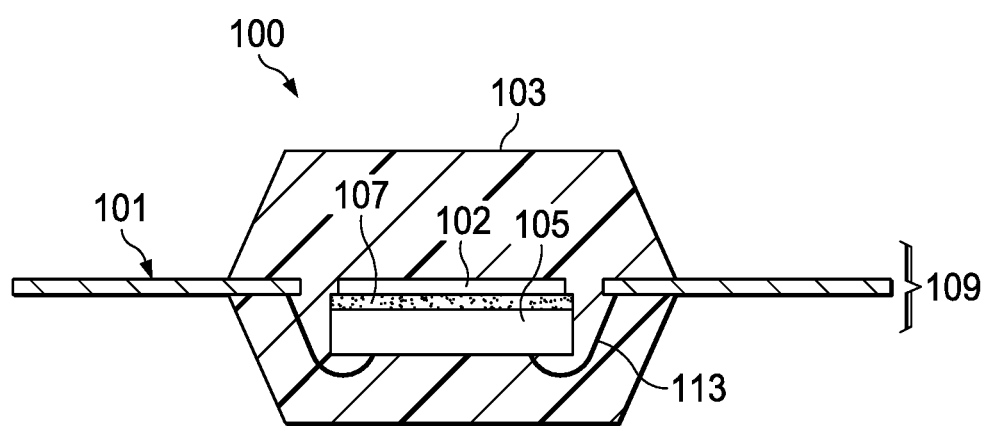
FIG. 2 illustrates, in a cross section, a leaded package similar to that of FIG. 1.

In FIG. 2, a standard leaded semiconductor device package 100 is shown after a molding process and prior to a lead form step. In FIG. 2A, the package 100 has a semiconductor die 105 mounted by a die attach material 107 to a die pad 102 on package substrate 109. In the illustrated examples, the package substrate 109 has a die pad 102. In the example in FIG. 2A, the semiconductor die 105 is mounted "face down", with an active surface facing a board side of package 100, and with the backside surface of the semiconductor die 105 attached to the die pad 102 on the board side of the package substrate 109, in an alternative arrangement the semiconductor die 105 can be mounted "face up" on the top side surface of the package substrate 109, and with the active surface in a face up arrangement facing away from the board side of the package 100. Depending on other factors, such as thermal dissipation requirements for the completed device, the package substrate 109 can be arranged to receive the semiconductor die 105 on either side. Leads 101 extend from within the mold compound 103 through the outer periphery of the molded package to distal ends. In an alternative arrangement, the leads 101 will not extend beyond the periphery of the package body, to form a no lead package.

Figure 3:
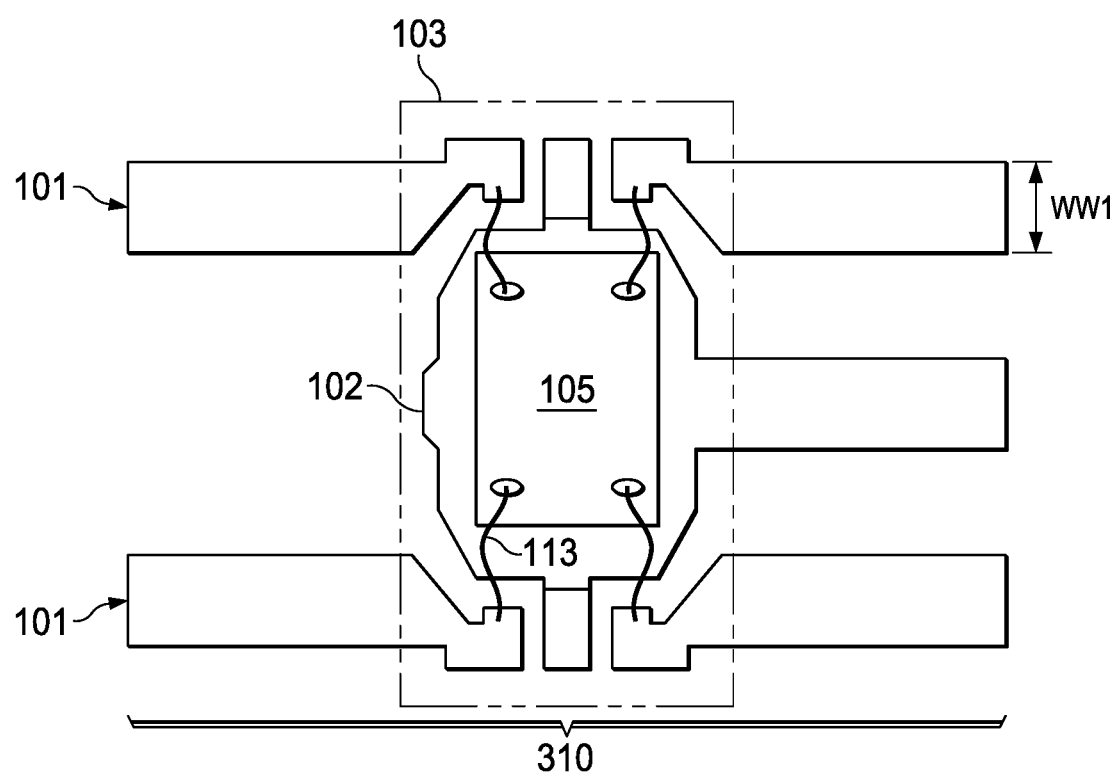
FIG. 3 illustrates, in a plan view the leaded semiconductor device package of FIG. 2.

FIG. 3 illustrates a lead frame 310 after a wire bonding process. Semiconductor die 105 is shown mounted to the die pad 102, and electrical connections in the form of wire bonds 113 couple bond pads on the semiconductor die 105 to leads 101. Mold compound 103 forms the package body for the device, and is shown covering the electrical connections, here bond wires 113, and proximal ends of leads 101 adjacent to and spaced from the die pad 102. The leads 101 have a width WW1. In FIG. 3, the encapsulation step is complete, and leads 101 are shown extending from the mold compound 103, prior to a form step to shape the leads 101.

Figure 4A:
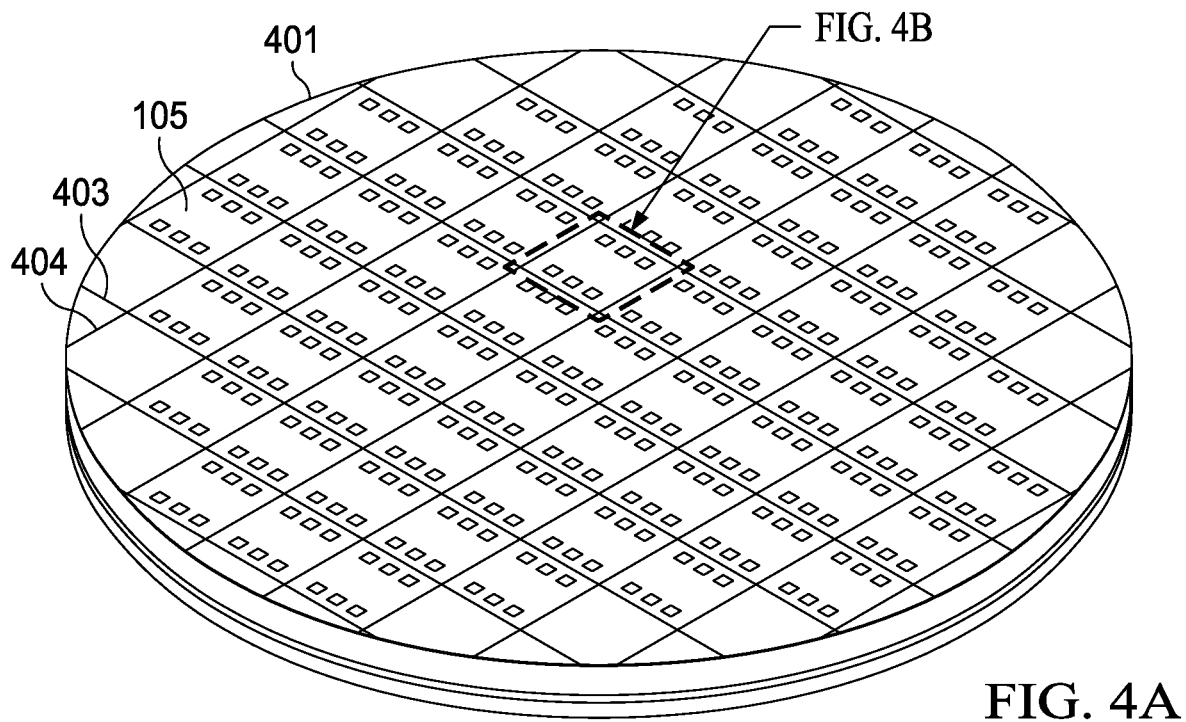
FIGS. 4A-4B illustrate in a projection view and a close up view, respectively, semiconductor dies with bond pads formed on a semiconductor wafer.
Figure 4B:
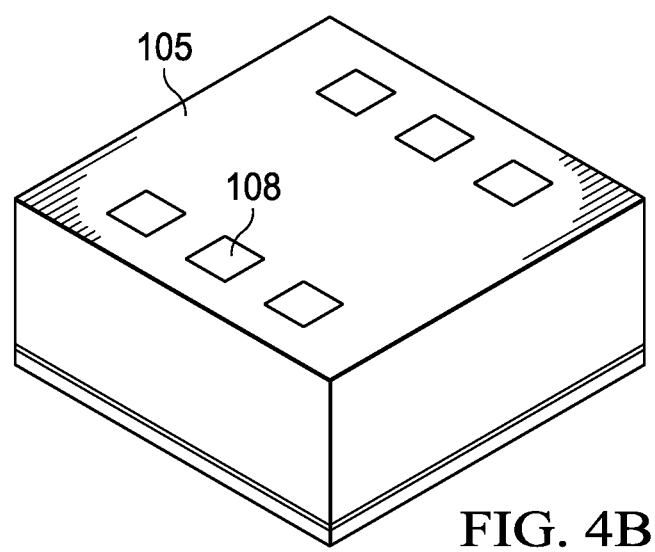

FIGS. 4A-4B illustrate steps used in forming semiconductor dies for use in the arrangements. In FIG. 4A, a semiconductor wafer 401 is shown with an array of semiconductor dies 105 in rows and columns formed on an active surface of the semiconductor wafer 401. The semiconductor dies 105 are formed using manufacturing processes in a semiconductor manufacturing facility, including ion implant, doping, anneals, oxidation, dielectric and metal deposition, photolithography, pattern, etch, chemical mechanical polishing (CMP), electroplating, and other processes for making semiconductor devices. Vertical and horizontal (as the wafer 401 is oriented in FIG. 4A) scribe lanes 403 and 404, which are perpendicular to one another and which run in parallel groups across the wafer 401, separate the rows and columns of the completed semiconductor dies, and provide areas for dicing the wafer 401 to separate the semiconductor dies 105 from one another.

FIG. 4B illustrates a single semiconductor die 105, with bond pads 108, which are conductive pads that are electrically coupled to devices (not shown for simplicity) formed in the semiconductor die 105. The bond pads 108 are at an upper level of metallization layers that lie over the semiconductor substrate of semiconductor die 105, and in examples the bond pads may be formed of aluminum or another conductor such as gold or copper. In addition, platings such as nickel, gold, silver, palladium, tin and platinum can be performed on the bond pads 108 to improve solderability and reduce ion diffusion, and multilayer platings such as ENIG (electroless nickel, immersion gold) and ENEPIG (electroless nickel, electroless palladium, immersion gold) an be used to improve bond strength when the semiconductor die is wire bonded.

Figure 5A:
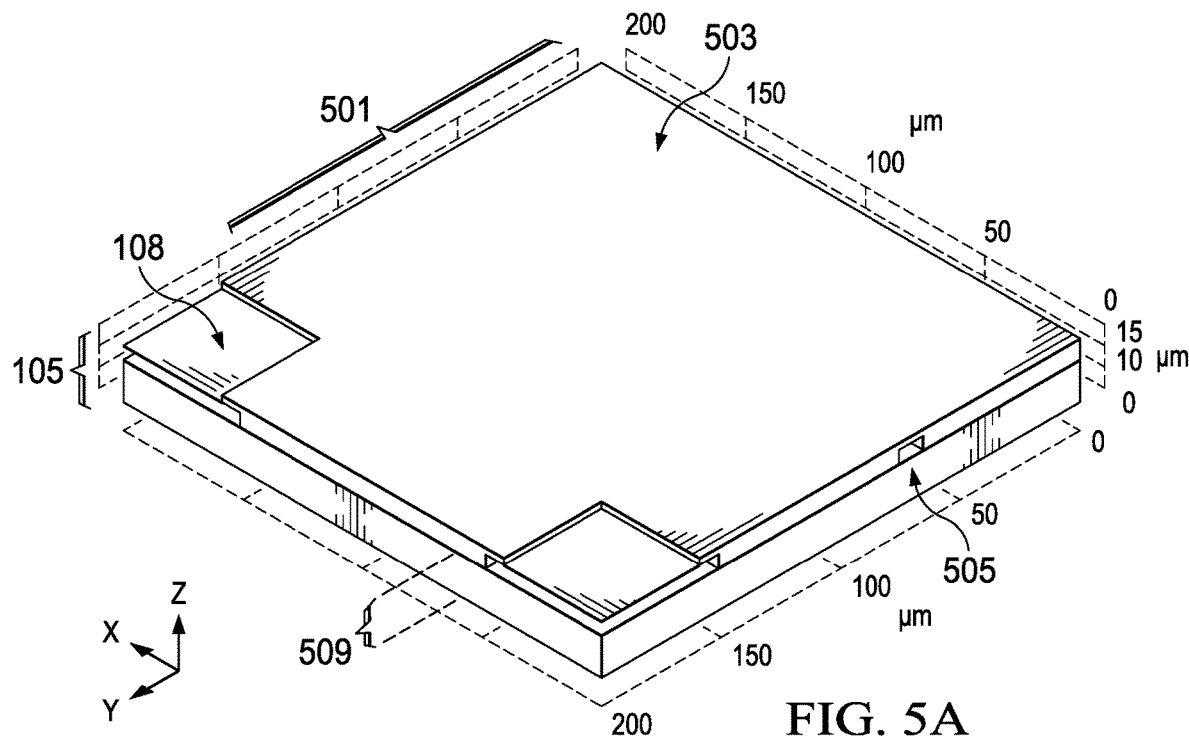
FIGS. 5A-5C illustrate, in a series of projection views, steps used in wafer probe testing, and in FIG. 5D, in a projection view, damage due to arcing events is shown on a semiconductor device.

FIGS. 5A-5D illustrate, in a series of projection views, an example wafer probe of a bond pad on a semiconductor die, and arcing. In FIG. 5A, a portion of a semiconductor die 105 is shown. Bond pads 108 are cut through on the left side of the figure, the figure illustrates one quarter of the bond pads 108. The area 501 is outside of the device area on the semiconductor die 105, and is part of the scribe lane area. In manufacturing semiconductor dies, certain structures are placed in the scribe lane area to enable wafer probe testing, such as power and ground traces. A trace 505 is formed running parallel to the bond pads 108 spaced from the bond pads, the trace 505 is a ground trace and is placed at ground during testing. The example portion shown is 200 microns× 200 microns, and one quarter of the bond pads 108 is 50 micron by 50 microns, so that the bond pads are 100 microns×100 microns. A protective overcoat layer 503 is shown overlying the semiconductor die 105 with openings exposing the surfaces of bond pads 108. In an example arrangement, the semiconductor die 105 is a power transistor device, and the bond pads 108 are aluminum bond pads, and trace 505 is also made of the same level metal in the semiconductor device 105, the top metal layer. The bond pad 108 and the trace 505 overlies the remaining metallization layers and the silicon substrate 509.

Figure 5B:
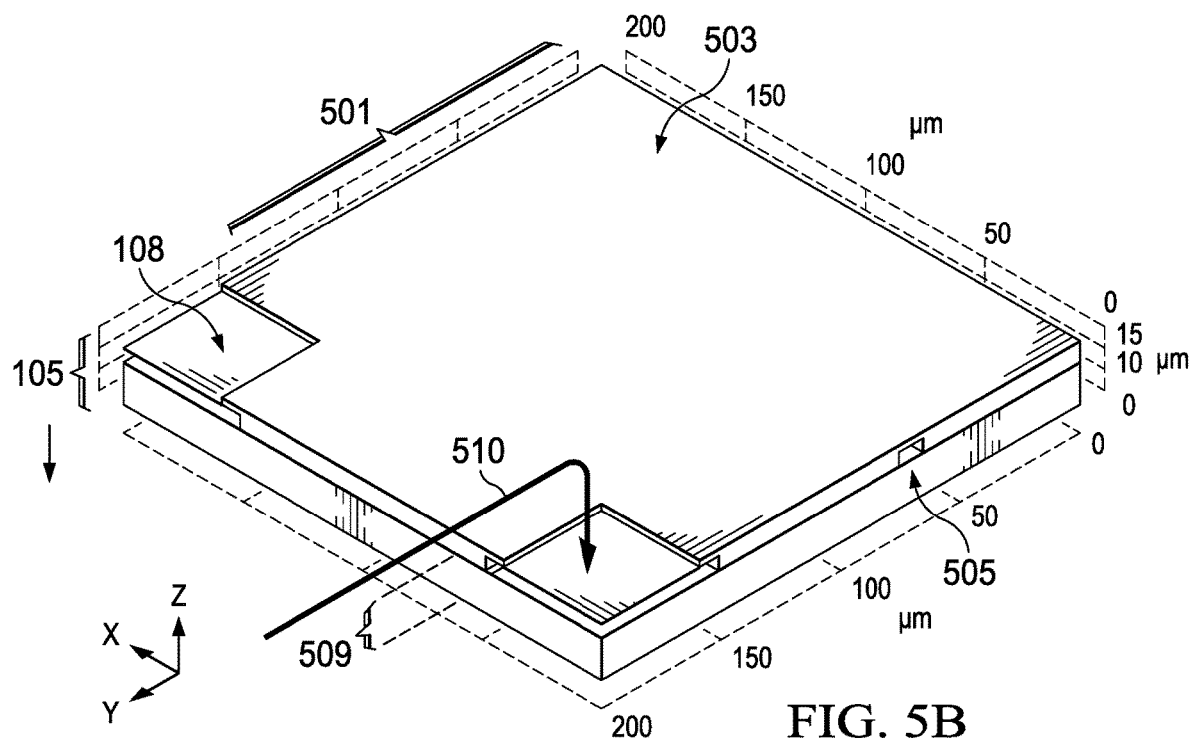

FIG. 5B illustrates a wafer probe needle 510 being brought into contact with a bond pad 108. In an example, the bond pad 108 is a drain terminal for a power FET device. Additional wafer probe needles (not shown) can be brought into contact with other terminals for the power FET device, such as a gate terminal, in order to test the operation of the device. At this stage, the semiconductor die 105 is still part of a semiconductor wafer under test during wafer probe test. Because the semiconductor dies are not packaged, the wafer probe tester has many probes to provide power, ground and signals to the devices to operate the devices prior to completing the packaging steps.

Figure 5C:
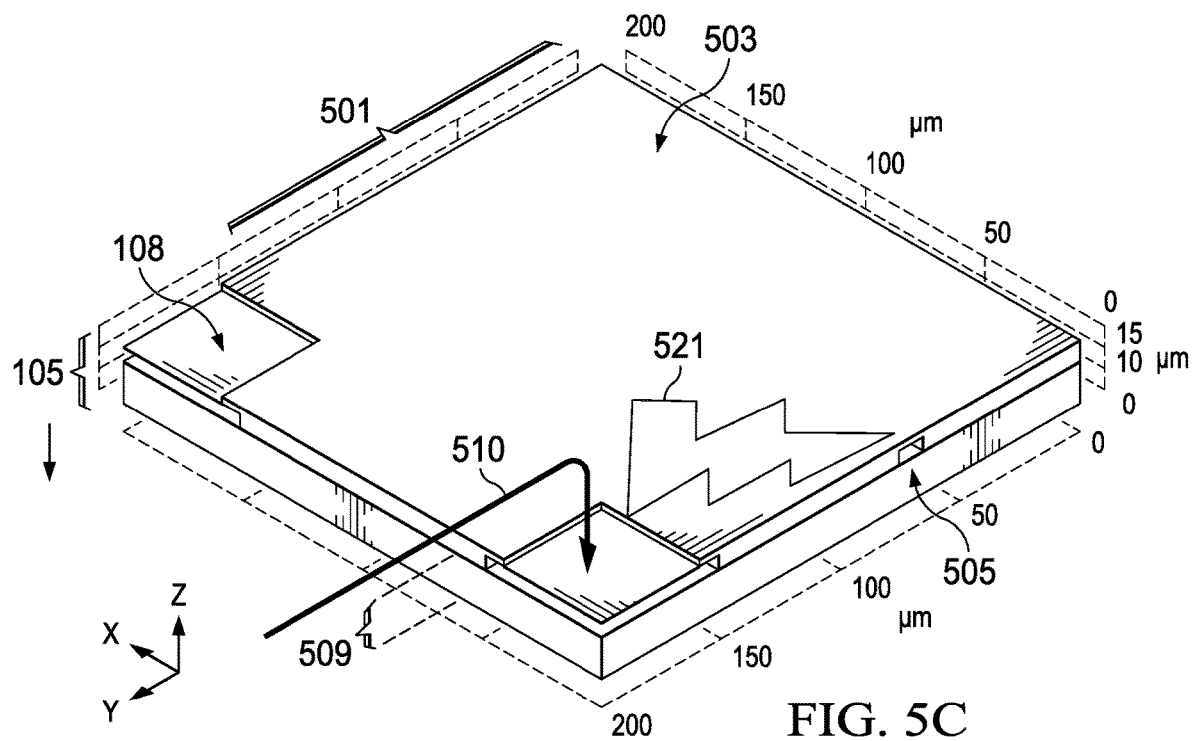

FIG. 5C illustrates the wafer probe 510 carrying a voltage +V while contacting bond pad 108. In FIG. 5C an arc 521 is shown forming in the air surrounding the semiconductor die 105 between the bond pad 108 and the trace 505. Trace 505 is, at this time, coupled to a ground potential. The voltage +V can be aa high voltage, to test the operation of a high voltage device, and can be tens, hundreds or even thousands of volts, depending on the power device being tested. The arc forms because the electric field at the edge of the bond pad is great enough to cause the air between the bond pad 108 and trace 505 to experience dielectric breakdown and become conductive. Current flows from the bond pad to the trace 505, causing damage to the semiconductor die.

Figure 5D:
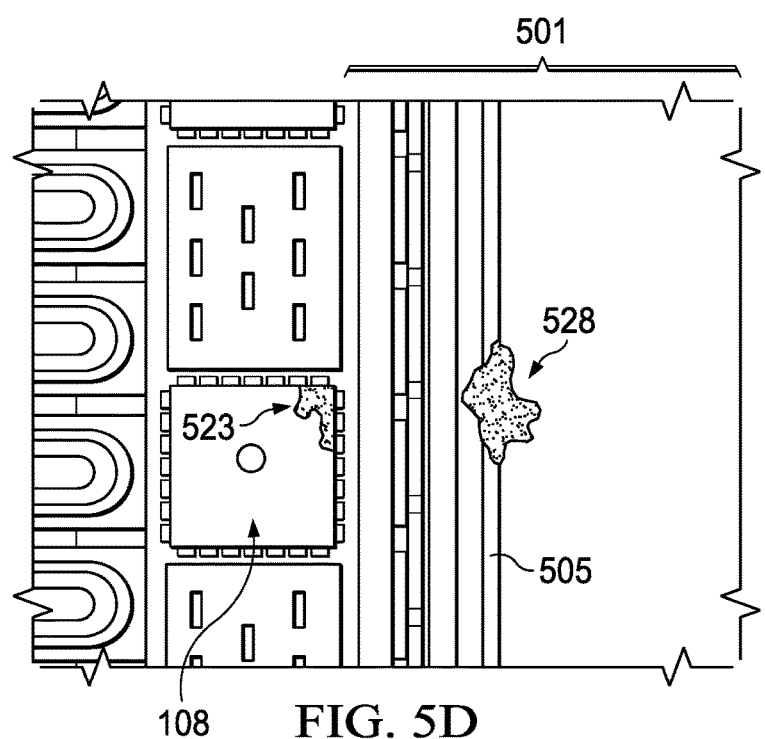

FIG. 5D illustrates in a drawing some arc damage observed to a power semiconductor die during wafer probe test. Bond pad 108 is shown with trace 505 underneath a PO layer and running parallel to the bond pad 108 in scribe lane 501. In bond pad 108, arc damage 523 is visible in the upper right corner, and on trace 505, which is running parallel to bond pad 508, arc damage 528 is shown. The arc damage occurs during wafer probe testing, and may result in the scrapping of an otherwise good semiconductor die, reducing device yields and increasing costs.

Figure 6A:
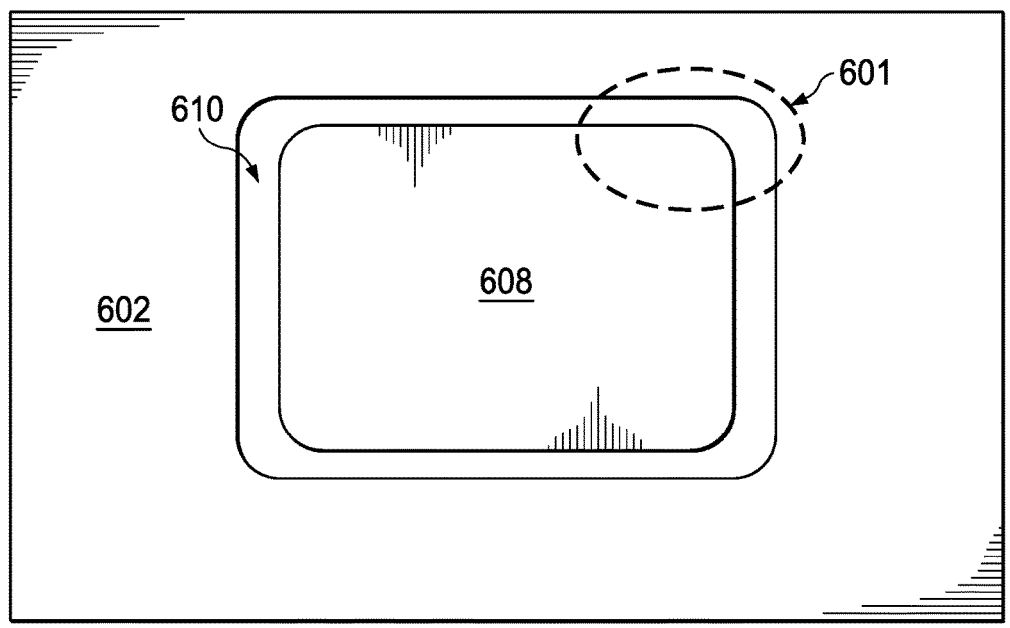
FIGS. 6A-6AA, 6B-6BB, 6C-6CC, and 6D-6DD illustrate, in plan views and respective cross sectional views, bond pads formed using various arrangements.
Figure 6A:
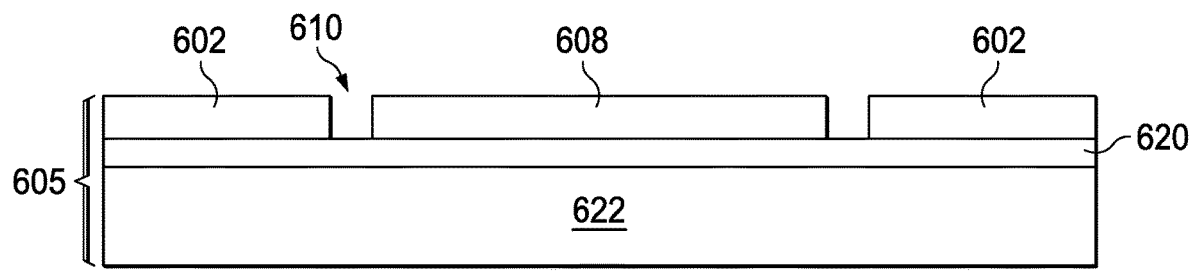

FIGS. 6A-6AA, 6B-6BB, 6C-6CC and 6D-6DD illustrate, in a series of plan views and respective cross sections, arrangements for reducing field strength problems at the boundary of bond pads on a semiconductor device by changing materials. The approaches rely on a field smoothing effect that can be attained by use of various materials at the boundary of the bond pads. The materials generally have a dielectric constant k that is less than 3.9, the dielectric constant of silicon dioxide, and in some cases less than 3, or less than 3.5, as described below.

FIGS. 6A-6AA illustrate, in a top view and a cross sectional view, the metallization features of an example bond pad 608 Bond pad 608 can be, for example, an aluminum bond pad formed on a device side surface of a semiconductor die. The bond pad 608 in FIG. 6A is a rectangular shape with filleted inside and rounded outside corners, that is the outside corners have a rounded contour. The bond pad has an upper surface, the surface facing away from the semiconductor substrate 622, and a bottom surface that is over silicon dioxide layer 620, overlying semiconductor substrate 622. The bond pad 608 has vertical sides extending from the upper surface to the lower surface along an outer boundary. As shown in FIG. 6A in area 601, the area where the highest electric field strength will be generated is often at the corner of a bond pad, where the outer boundary of the bond pad 608 is spaced from a ground plane 602 in this example. Alternative shapes for the bond pad include rectangular shapes, oval, and round or disc shapes. As is further described below, the rectangular shape with fillet inside corners and rounded outside corners generally performs better, in terms of electric field strength at the corners, than the other shapes. A ground plane 602 is shown formed of the same top metal, in this example aluminum, as the bond pad 108, and surrounding the bond pad, with a space 610 between the bond pad 608 and the ground plane 602. The ground plane 602 is used to isolate bond pad 608 from other nearby bond pads (not shown) and to reduce noise and coupling interference between the bond pads.

FIG. 6AA is a cross section of the plan view of FIG. 6A. In FIG. 6AA, the bond pad 608, and ground plane 602, are shown overlying a dielectric layer, such as silicon dioxide, 620, and the remaining layers and silicon substrate 622 of the semiconductor die 605. Spacing 610 is shown between the vertical sides of the bond pad 608 at the outer boundary of the bond pad and vertical sides of the ground plane 602.

Figure 6B:
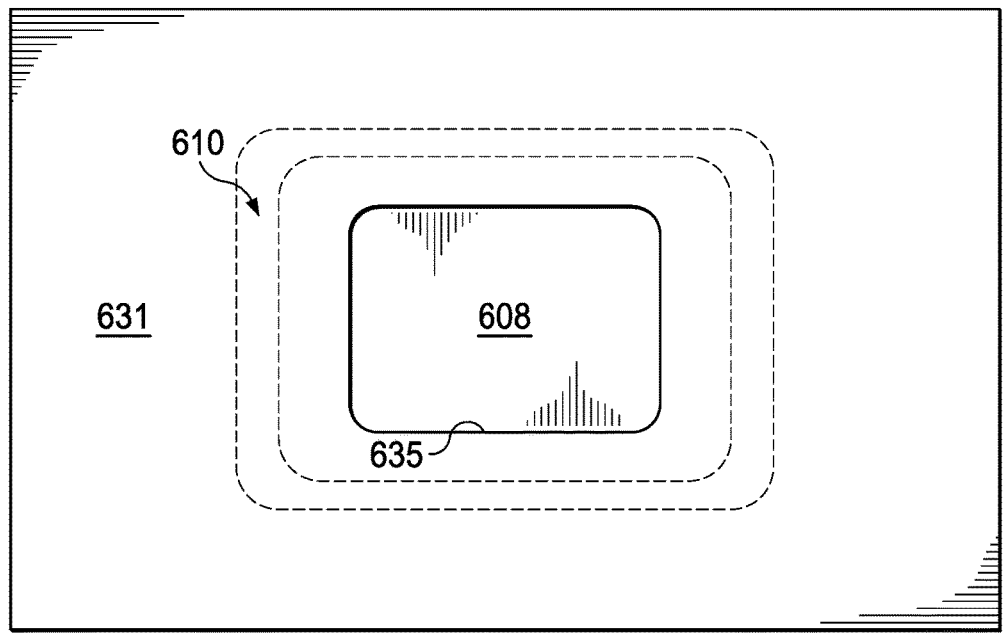
Figure 6B:
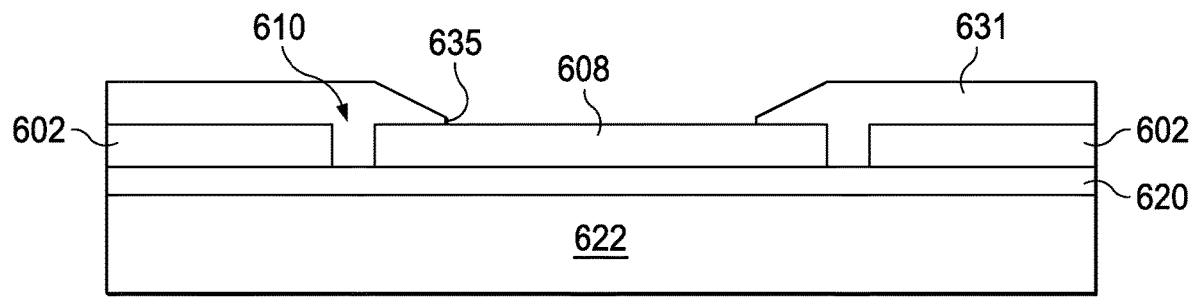

In FIGS. 6B-6BB, an arrangement for smoothing the electric field at the boundary of the bond pad 608 is shown. In FIG. 6B, a dielectric material 631 is formed overlying the ground plane 602, covering the space 610, and overlying a portion of an upper surface of bond pad 608, while leaving the remaining portion of the upper surface is exposed from the dielectric material 631. The dielectric material 631 is used where, in an example formed without the use of the arrangements, a protective overcoat (PO) layer is used. PO materials are usually silicon nitride, silicon dioxide, silicon oxynitride, or multiple layers of these. In the arrangements, the dielectric material 631 is chosen to have dielectric constants k that are less than 3.5. Example materials that can be used include porous dielectrics including porous silicon dioxide, porous silicon dioxide, and porous silicon nitride. Because the dielectric breakdown that occurs during arcing events is both the air and the dielectric material used, using a lower dielectric constant material means that less of the electric field reaches the air, more of the electric field is contained within the dielectric material 631 when compared to a silicon dioxide layer used in an example without the arrangements. The electric field strength along the bond pad is smoothed due to the use of the dielectric material 631 overlying the boundary portions of the bond pads, reducing "hot spots" where the electric field is greater than surrounding areas, and arcing is reduced or prevented.

Figure 6C:
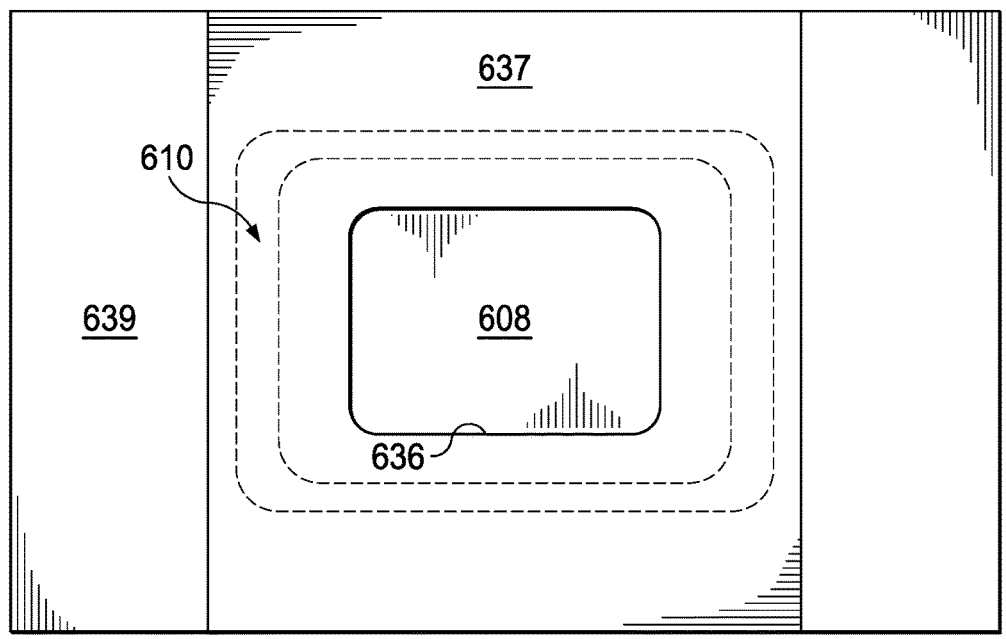
Figure 6C:
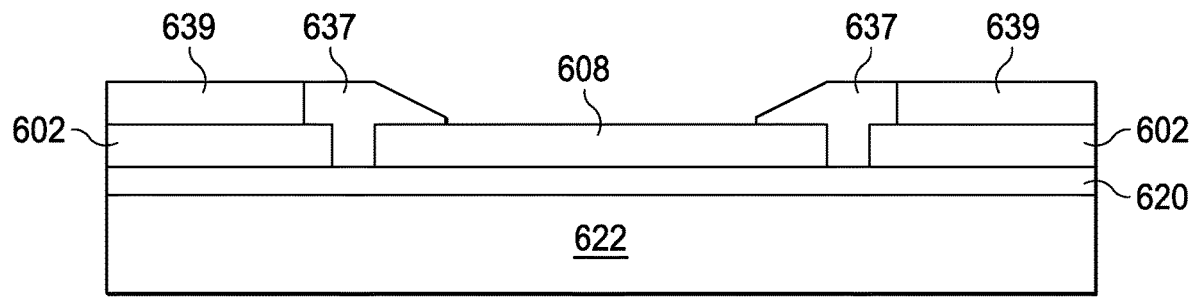

FIGS. 6C and 6CC illustrate, in a plan view and a cross section, an arrangement using non-linear field grading films to smooth the electric field at the bond pad boundary regions. In FIGS. 6C and 6CC, bond pad 608 is shown spaced from ground plane 602 by a space 610. A non-linear field grading material 637 is formed overlying the boundaries of the bond pad 608, and an opening 636 in the non-linear field grading material 637 exposes the remainder of the upper surface of bond pad 608 in the central portion. A PO material 639, such as silicon nitride, silicon dioxide, silicon oxynitride, is formed adjacent the non-linear field grading material and extending over the ground plane 602. The ground plane 602 and the bond pad 608 are formed in the top metal layer of metallization overlying a silicon substrate 622, and a layer of silicon dioxide 620 covers the silicon substrate 622. The top metal in an example is aluminum.

The non-linear field grading materials can be selected from barium titanate (BTO), barium zirconate titanante (BZT), and phosphorous doped zinc oxide (PZO) films. The use of these non-linear field grading materials at the boundary of the bond pad 608 reduces electric field strength and reduces non-uniform peaks in the electric field, reducing arcing events at wafer probe.

Figure 6D:
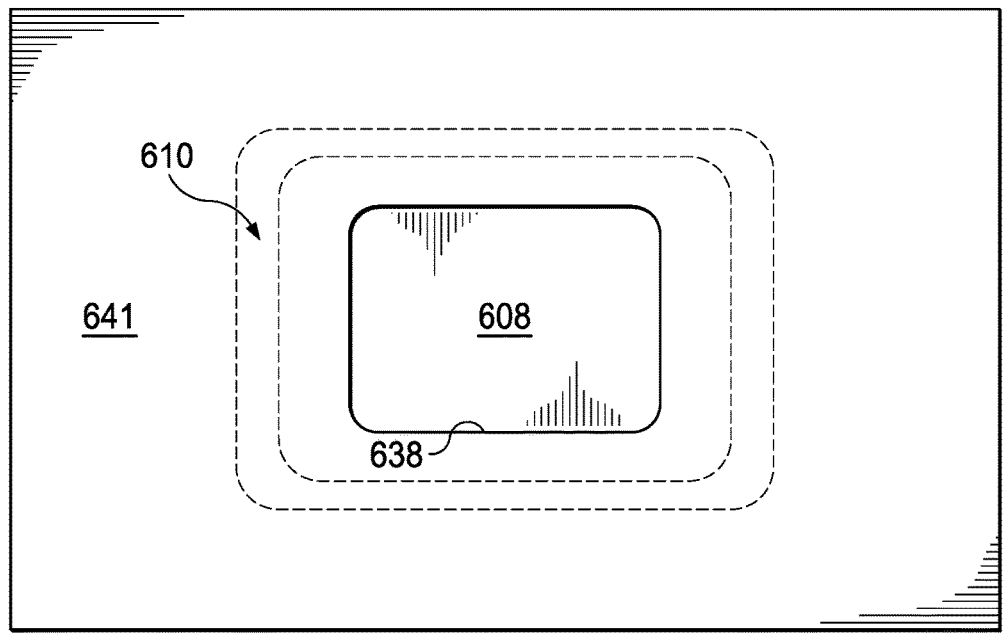
Figure 6D:
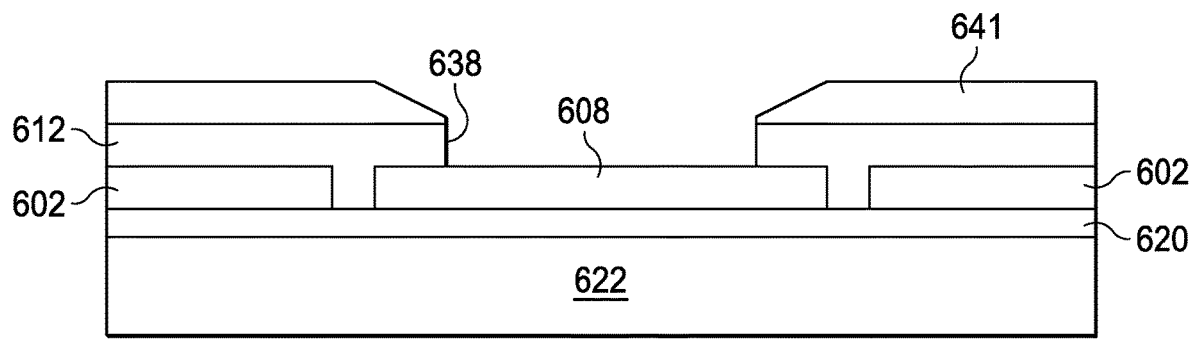

FIGS. 6D and 6DD illustrate in another plan view and a cross section, respectively, an additional arrangement. In FIGS. 6D and 6DD, a bond pad 608 is shown with a layer of PO 612 overlying the boundary portion of the bond pad 608, and the ground plane 602; and a layer of a low permittivity die coat material 641 overlies the PO 612. An opening 638 in both the PO layer 612, which can be a silicon nitride, silicon oxide, silicon oxynitride, and the low permittivity die coat material 641, exposes the upper surface of bond pad 608 from the two layers 612, 641. Materials that can be used for the low permittivity die coat 641 are materials with a dielectric constant k less than 3, and useful examples include bisbenzocyclotene (BCB) bismaleimide triazine (BT) resin, and photoresist materials DMI-3005, DMI-3006, which are available from Designer Molecules Inc., and are described as modified polyimide materials. Use of these materials at the boundary of the upper surface of the bond pads 608 reduces arcing events during wafer probe.

Figure 7A:
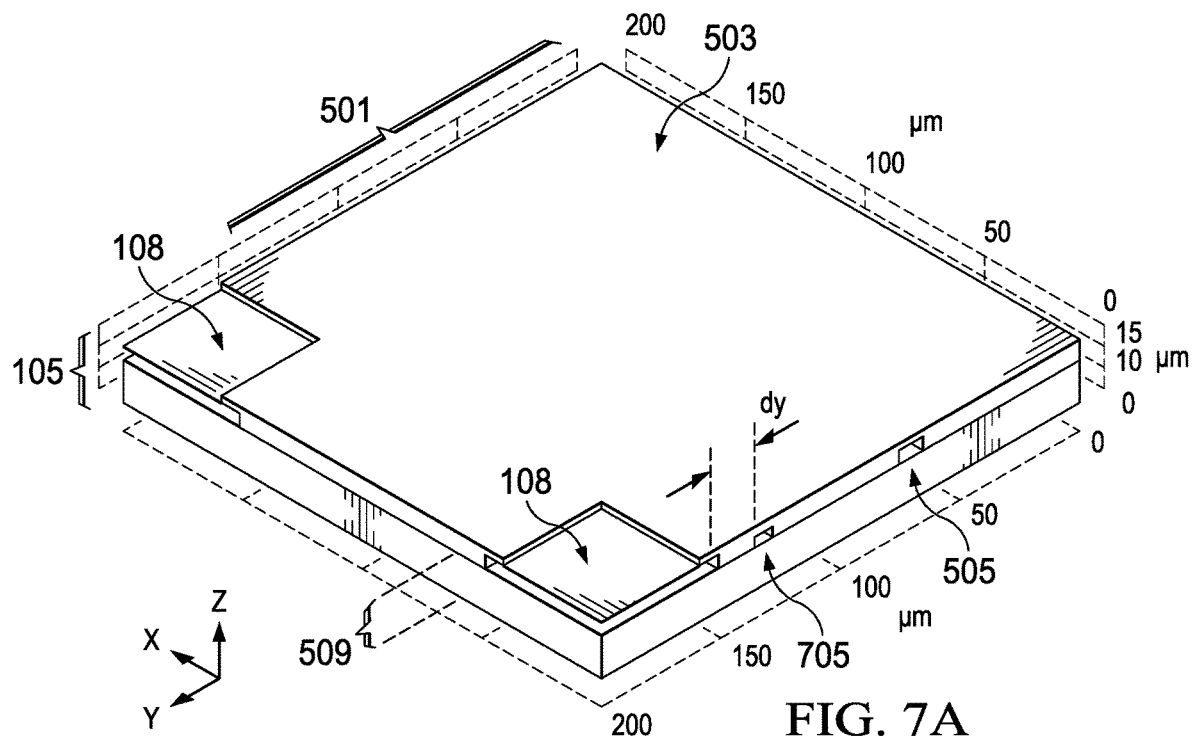
FIGS. 7A-7B illustrate, in a projection view and a graph, an arrangement for a bond pad with a floating trace, and results obtained for the arrangement.

FIG. 7A illustrates another arrangement. Returning to a simple bond pad illustration similar to that of FIG. 5A, bond pads 108 are shown in a partial view of a semiconductor die 105. The scribe line area 501 is shown extending away from the device area of a semiconductor die 105, with bond pads 108 exposed from a protective overcoat (PO) layer 503. The arrangement of FIG. 7A includes a floating trace 705 that is formed from the same top level metal layer material as bond pads 108, in this example, the top metal layer is aluminum, although copper and gold, could be used. The floating trace 705 is a conductor that is not tied to a voltage potential, and which runs parallel to the straight sides of rectangular bond pads 108, and is between the boundary of the bond pads 108 and the voltage trace 505, which can be at ground or at another potential.

The floating trace 705 is shown formed in the same metal layer as the bond pad 108 and lies under PO layer 503. In an alternative arrangement, the floating trace 705 can be formed over the PO layer 503; however, the benefits are less for that arrangement. To determine the most effective location for the floating trace 705, experiments can be performed, or alternatively simulations, for example using finite element modeling analysis, can be used. As shown in FIG. 7A. the spacing distance can be a space dy. In an example, the distance dy for a particular aluminum bond pad with an aluminum floating trace was determined by simulating the electric field strength for cases where the distance dy was varied, from about 0.5 microns to 16 microns.

Figure 7B:
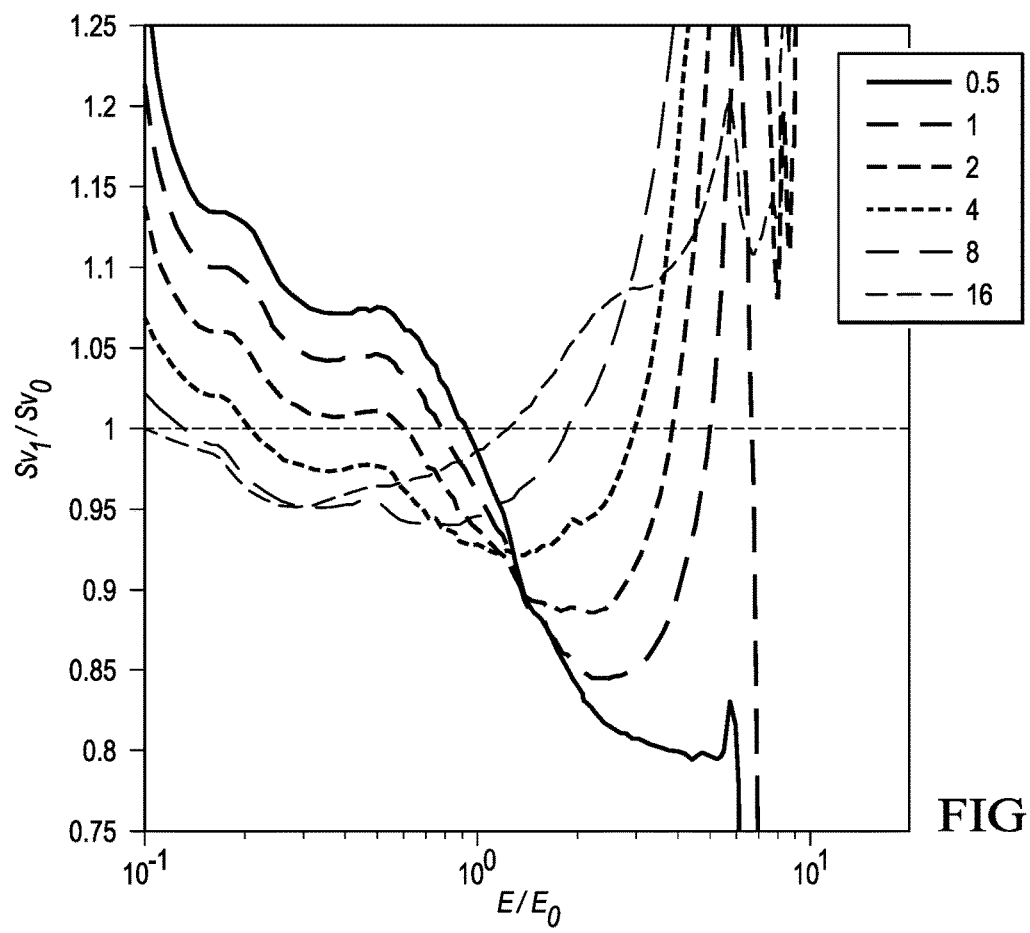

FIG. 7B illustrates in a graph a stress volume $Sv_1/Sv_o$ ratio plotted on the Y axis, and an electric field ratio $E/E_o$ on the X axis, the X axis is a log scale. When the electric field ratio $E/E_o$ is "1", the electric field being measured is the same as the average for the entire bond pad, which is considered a good result. An electric field ratio measurement of less than 1 means the electric field is less than the average for the entire bond pad, and lower values are better. Similarly, a stress volume ratio of less than 1 for a given electric field is better. Simulations were performed varying dy, and plotted. As shown in FIG. 7B, the electric field ratios $E/E_o$ were best when the distance dy was less than 4 microns. The stress volume scale (Y axis) indicates for these values, the stress volume ratio is reduced lower than 1. As the spacing distance dy increased beyond 4 microns, the results indicate increasing electric field strengths.

The arrangement of FIG. 7A illustrates an example with very simple rectangular bond pad shapes for bond pads 108. However, in various arrangements, a floating trace can be formed spaced from a bond pad of any shape and between a bond pad and the nearest ground plane, and the electric field strength can be improved. The rounded corner rectangular shapes of FIGS. 6A-6D for bond pads can be used, for example. The floating trace can be a straight line as shown in FIG. 7A, or can be other shapes to provide the benefits. The floating trace can be asymmetric, and may surround a bond pad at the spacing distance, for example.

In another arrangement, changes to the shape of the bond pad to improve the electric field strength along the boundary of the bond pad, and to reduce the likelihood of arcing, are made. In a method approach, an algorithm is developed for iteratively changing the shape of a bond pad, determining the result on the electric field strength, and repeating the process. Eventually, the performance obtained for the bond pad design is determined to be acceptable and the new bond pad shape is used in making a semiconductor die, and the semiconductor die can be packaged to form a semiconductor device. The method can be performed iteratively until the best performance is found by reaching a point where additional changes to the bond pad do not result in better performance, in an optimization approach. Alternatively a predetermined threshold for the electric field strength ratio can be used, when the bond pad design results in an electric field strength ratio that is below a predetermined threshold, the bond pad design can be used in the semiconductor die.

Returning to FIG. 5A, the area 601 indicates the highest electric field strengths are in the corner areas. The space 610 from the bond pad boundary to the nearest ground plane is used in finite element modeling to determine how to change the bond pad shape to improve the performance, and reduce the likelihood of arcing.

Figure 8A:
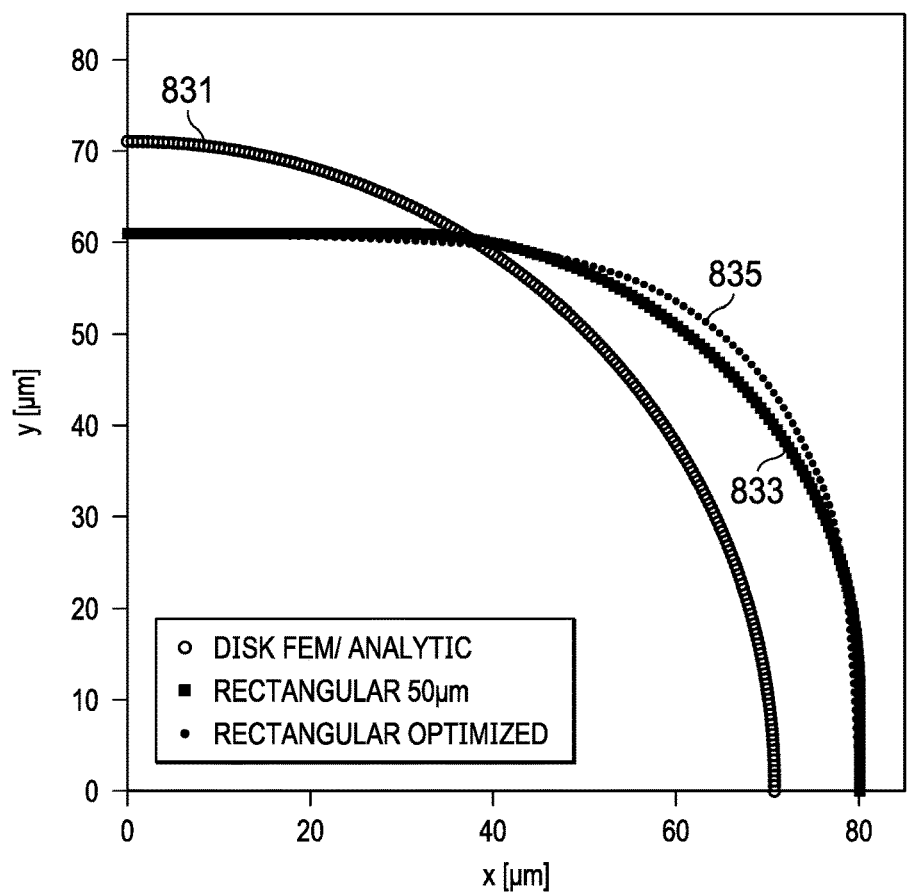
FIGS. 8A-8B illustrate, in a geometry graph and a simulation graph, results obtained for various bond pad shapes of arrangements.
Figure 8B:
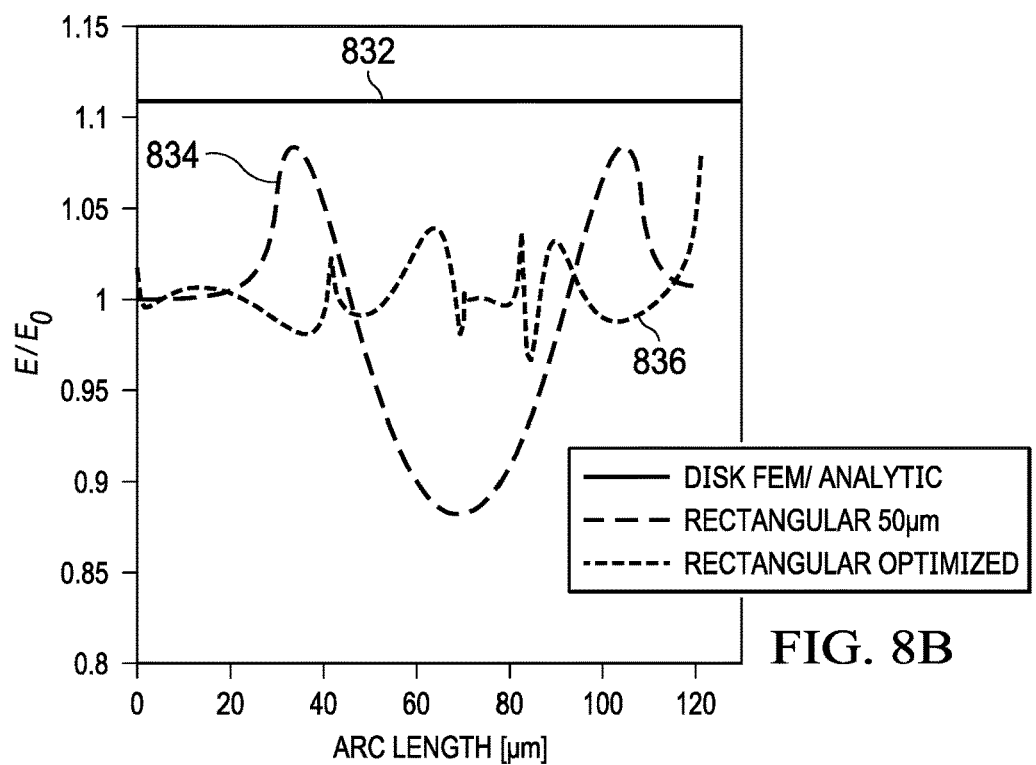

FIG. 8A indicates, in a plot of possible corner shapes for a bond pad, shapes that were formed and simulated. A common approach to a bond pad shape is to use a round or disc shape, thereby eliminating corner effects. In FIG. 8A, curve 801 illustrates a disc shaped bond pad with radius of about 70 microns, see curve 831 in FIG. 8A. As shown in FIG. 8B, however, the electric field strength simulations for this case were discouraging. While the electric field is uniform, the ratio $E/E_o$ is also greater than 1, that is, over the desired threshold.

A rectangle with rounded outside corners was then simulated, see curve 833 in FIG. 8A, the radius of the curve is about 50 microns. As shown in FIG. 8B, curve 834, the results were encouraging in some areas, however, the electric field ratio includes areas where it higher than the target threshold.

Finally, a method for modifying the bond pad shape was applied to the rectangle with rounded corners, and an optimized shape was obtained. The curve 835 in FIG. 8A shows the resulting shape, which is non-uniform along the radius. In FIG. 8B, the electric field strength ratio is shown in curve 836. In this case, the ratio $E/E_o$ remains close to 1 along the entire curve, which is desirable, and never exceeds 1.04. This bond pad shape was the one selected in this example.

Figure 9:
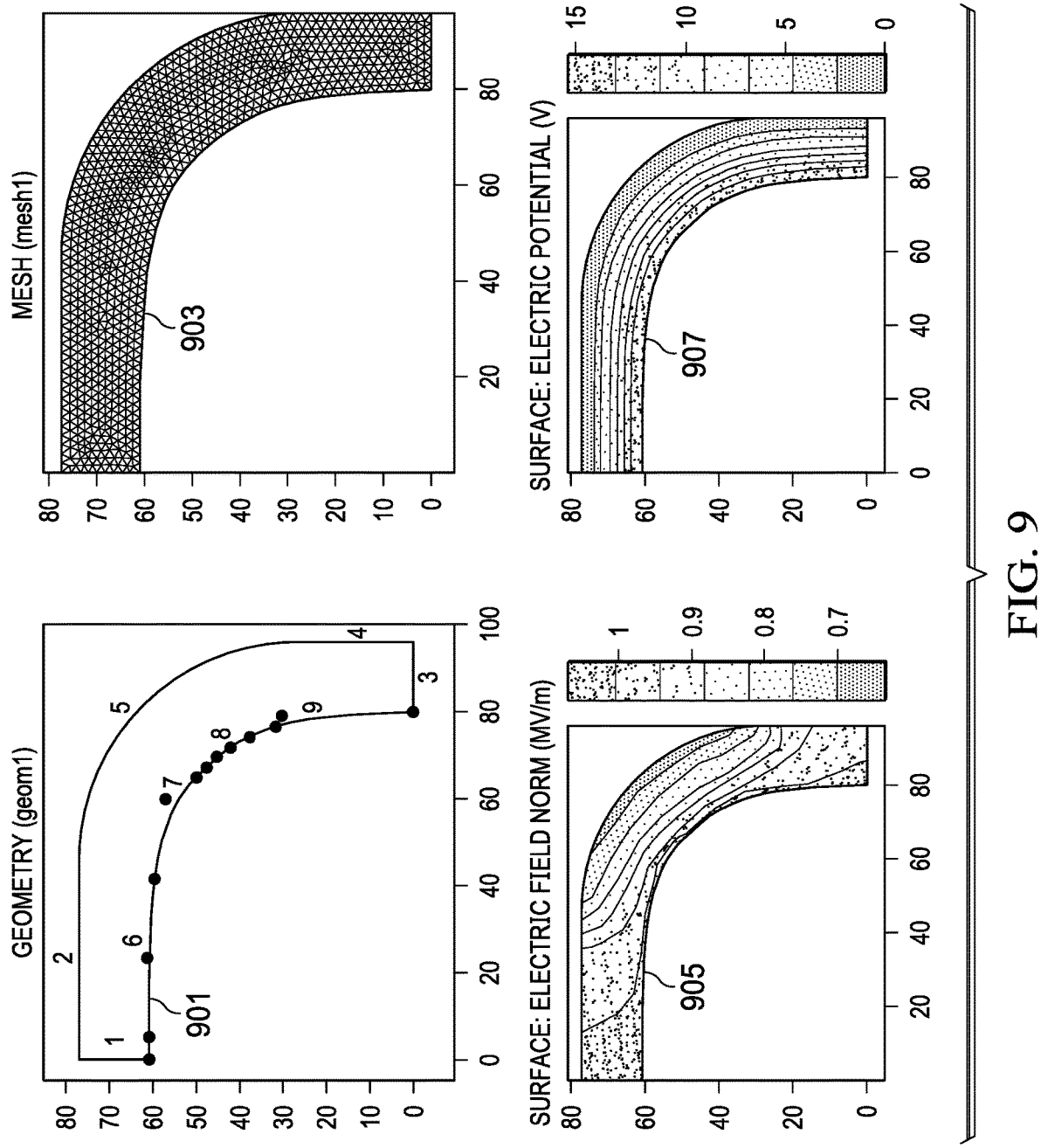
FIG. 9 illustrates, in graphs, finite element analysis results for a method for changing the bond pad shapes.

FIG. 9 illustrates some simulation results obtained using a Bezier curve analysis approach to analyze a corner shape of a bond pad. In FIG. 9. the geometry plot 901 shows a curve for the bond pad and the ground plane spaced from the bond pad, and a series of Bezier nodes are shown. In the mesh plot 903, the same curves are shown with a mesh analysis. In the plot 905, the surface electric field is plotted along the curve of the bond pad corner. In the plot 907, the surface electric potential is plotted along the curve. These simulation results can be used with proposed bond pad shapes to evaluate the expected performance. The shapes can be adaptively changed to improve performance until either an acceptable bond pad shape is reached, or, until no further improvement is obtained by making additional changes to the shape.

Figure 10:
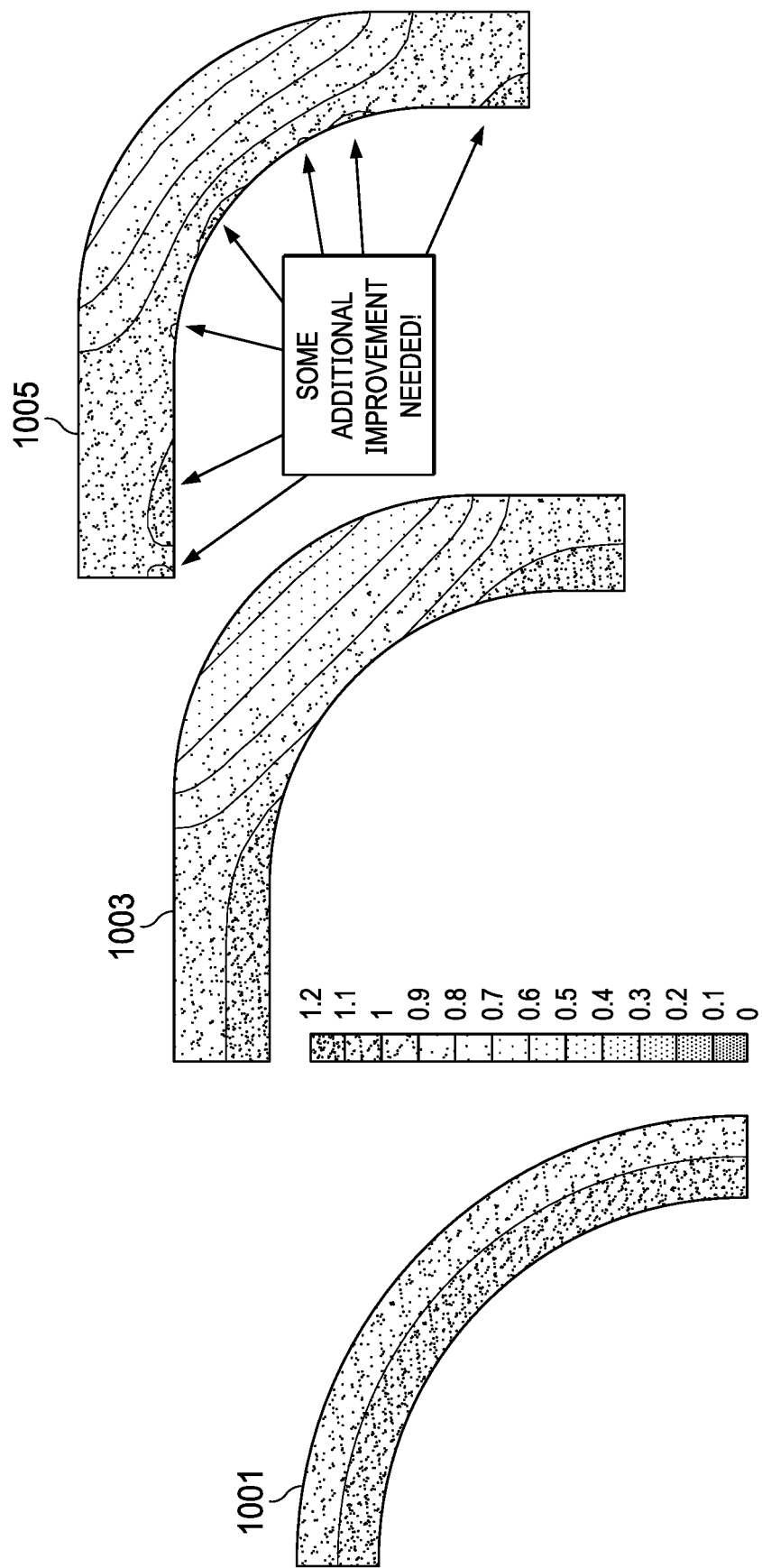
FIG. 10 illustrates, in a series of graphs, field strength results obtained for bond pad shapes used with the arrangements.

FIG. 10 illustrates, in three cases, the transitions of proposed bond pad shapes as an algorithm of the arrangements iteratively adjusts the shapes. In FIG. 10, plot 1001 indicates a starting bond pad shape, a simple disc, an example corner is shown, with the electric field strength between the bond pad outside corner and the ground plane plotted (see FIG. 6A, area 601 for an example of a corner).

In FIG. 10, curve 1003 indicates a shape obtained after some modifications to the initial round shape. The new bond pad shape is a rectangular shape with rounded outside corners, however, as shown in curve 1003, some high electric field portions remain along the curve. Curve 1005 indicates a bond pad shape curve after additional iterations modify the bond pad shape. While the electric field performance is improved as shown by the curve 1005, as noted in FIG. 10 there are still some high electric fields portions of the curve so additional iterations are suggested to obtain a better bond pad shape.

Figure 11:
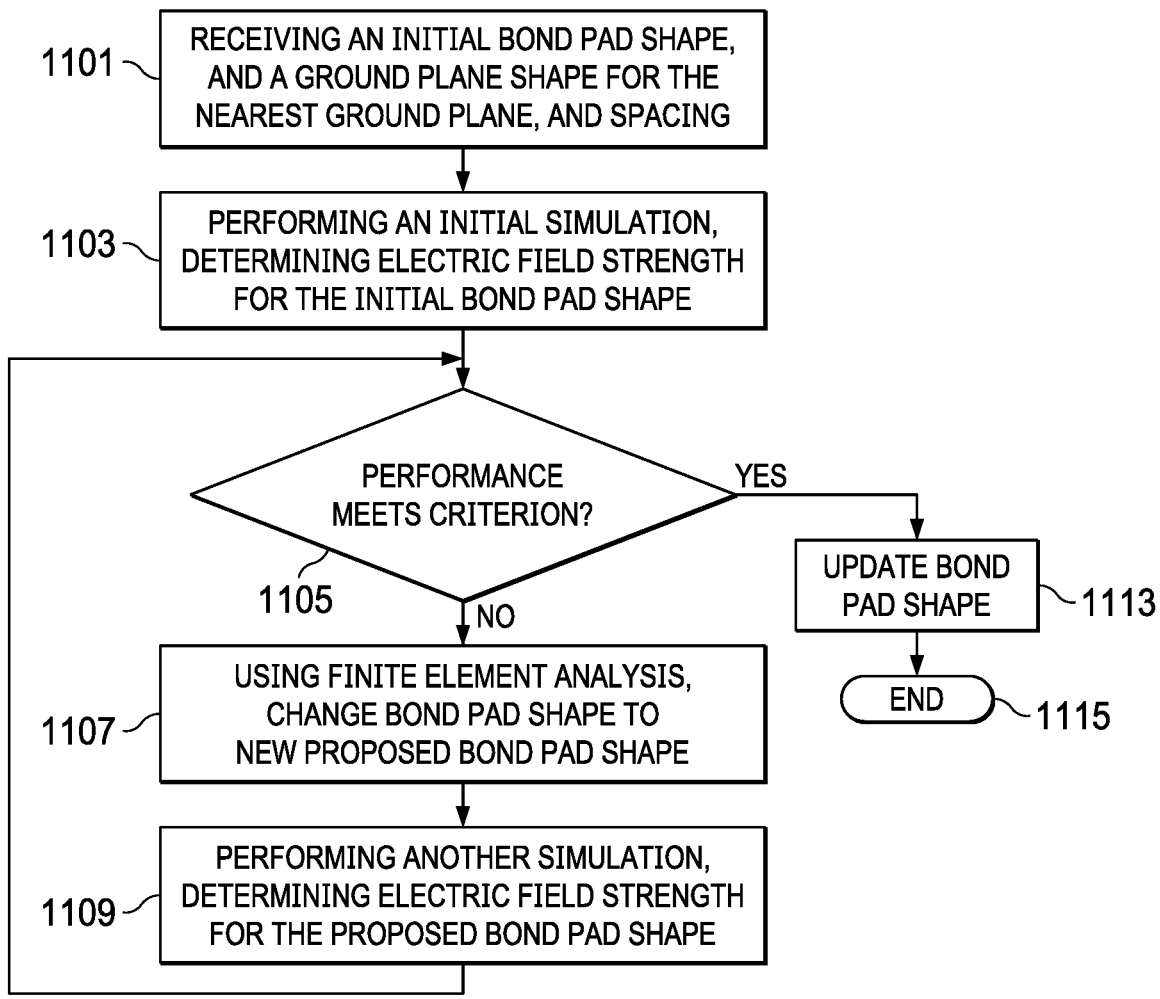
FIG. 11 illustrates in a flow diagram selected steps of a method for forming the arrangements.

FIG. 11 illustrates, in a flow diagram, a method for obtaining a bond pad shape. At step 1101, an initial bond pad shape is received. Additional information is collected, including the ground plane shape, and the spacing between the outside boundary of the bond pad and the ground plane. At step 1103, an initial simulation is performed using a computer simulator. Electric field strength is determined for the initial bond pad shape, for example see FIG. 10, 1001. At step 1105, again using the computer simulator, a decision is made. If the bond pad shape evaluated at step 1103 meets a predetermined performance criterion, such as an electric field strength below a threshold, or an electric field strength ratio $E/E_o$ below a threshold, the bond pad shape is complete. The method then transitions to step 1113.

If the performance criterion is not met, the method continues. At step 1107, a finite element analysis is used to determine how to change the shape of the bond pad. See FIG. 10, 1103, for example. In one approach, a Bezier curve analysis is performed. Other analysis methods can be used. The shape of the bond pad is adapted using the analysis, and at step 1109, another simulation is performed to obtain he electric field strength (or the ratio E/Eo) for the new proposed bond pad shape. An iteration loop includes the criterion step at 1105, the finite element analysis at step 1107, and the simulation at step 1109. This loop continues until the proposed bond pad shape in the current loop meets the performance criterion at step 1105. At step 1113, the bond pad shape is updated to the proposed bond shape. The method then ends. In the method of FIG. 11, the curve of the outside corners of the bond pad shape is altered. The overall area of the bond pad may change slightly, but the method does not greatly change the bond pad size or area, instead the shape of the bond pad is modified along the outer boundary to decrease the likelihood of arcing by improving the electric field performance.

The new bond pad shape that results from the method of FIG. 11 can be used to form a semiconductor die, and the semiconductor die can be manufactured on a wafer and mounted in a semiconductor device package using wire bonding, for example, as shown in FIG. 2.

The arrangements use several approaches to improving the electric field strength at the boundary of bond pads by reducing the electric field strength, which eliminates or reduces the likelihood of arcing, and the damage to the device that can result. In one approach, materials with low dielectric constants are used over the boundary of the bond pads to smooth the electric field. In another approach, a floating trace is formed in the same metallization layer of the bond pad spaced from the boundary of the bond pad by a small distance, less than 4 microns, to improve the electric field strength performance. In another approach, the shape of the bond pad is adapted from a starting shape using an algorithm to analyze the electric field performance for the bond pad shape, and iteratively updating the shape at the boundary of the bond pad until a performance criterion is met. The new bond shape is used to fabricate a semiconductor device. The various arrangements can be used together, or, as independent approaches to improving the bond pad performance.

Modifications are possible in the described arrangements, and other alternative arrangements are possible within the scope of the claims.

What is claimed is:

1. An apparatus, comprising:
a semiconductor die having bond pads on device side surface, the semiconductor die further comprising:
a ground plane spaced from bond pads by a spacing distance, the bond pads having an upper surface for receiving a ball bond, and having an outer boundary, and having vertical sides extending from the upper surface to a bottom surface, the bottom surface formed over the device side surface of the semiconductor die; and
a protective overcoat (PO) overlying the ground plane and overlying the vertical sides of the bond pads, and overlying a portion of the upper surface of the bond pads, and having an opening exposing the remaining portion of the upper surface of the bond pads, the PO having a dielectric constant of less than 3.8, wherein the semiconductor die further comprises a floating trace formed at a distance of less than 4 microns from the outer boundary of a bond pad.

2. The apparatus of claim 1, wherein the bond pads and the ground plane are aluminum, copper or gold.

3. The apparatus of claim 1, wherein the bond pads are aluminum.

4. The apparatus of claim 1, wherein the bond pad is aluminum and the floating trace is aluminum.

5. The apparatus of claim 1, wherein the bond pads on the semiconductor die have rectangular shapes with rounded outside corners.

6. The apparatus of claim 1, wherein the bond pads on the semiconductor die have rectangular shapes with rounded corners with non-uniform contours.

7. The apparatus of claim 1, wherein the semiconductor die comprises the PO and further comprising: a non-linear field grading material formed overlying the bond pad outer boundary and covering the vertical sides of the bond pads, the non-linear field grading material being one selected from barium titanate (BTO), barium zirconate titanante (BZT), and phosphorous doped zinc oxide (PZO) films.

8. The apparatus of claim 1, wherein the semiconductor die further comprises:
a layer of low permittivity die coat material overlying the PO, the low permittivity die coat material having a dielectric constant k of less than 3.

9. The apparatus of claim 8, wherein the layer of low permittivity die coat material is bisbenzocyclotene (BCB), bismaleimide triazine (BT) resin, DMI-3005, or DMI-3006.

10. An apparatus, comprising:
a semiconductor die having a bond pad over a device side surface, the bond pad having an upper surface configured for receiving a ball bond, a bottom surface over a semiconductor substrate, and having an outer boundary with vertical sides extending from the upper surface to the bottom surface; and
a floating trace formed on the device side surface of the semiconductor die and spaced from the bond pad, the floating trace within 4 microns of the outer boundary of the bond pad.

11. The apparatus of claim 10, wherein the bond pad is a rectangular bond pad, and the floating trace is a conductor that runs parallel to one of the sides of the bond pad.

12. The apparatus of claim 11, wherein the bond pad has a rectangular shape with rounded outside corners.

13. The apparatus of claim 11, wherein the floating trace and the bond pad are formed from a metal in a same level of metallization.

14. The apparatus of claim 13, wherein the floating trace and the bond pad are formed of aluminum, copper, or gold.

15. The apparatus of claim 10, and further comprising:
a protective overcoat (PO) overlying the floating trace and overlying the vertical sides of the bond pad and overlying a portion of the upper surface of the bond pads along the outer boundary, the PO having an opening exposing the remaining portion of the upper surface of the bond pad, the PO having a dielectric constant of less than 3.8.

16. The apparatus of claim 15, and further comprising:
the PO further comprising a non-linear field grading material formed overlying the outer boundary of the upper surface of the bond pad and covering the vertical sides of the bond pads, the non-linear field grading material comprising barium titanate (BTO), barium zirconate titanante (BZT), or phosphorous doped zinc oxide (PZO) films.

17. The apparatus of claim 15, and further comprising:
a layer of low permittivity die coat material overlying the PO and having a dielectric constant k of less than 3, wherein the layer of low permittivity die coat material comprises bisbenzocyclotene (BCB), bismaleimide triazine (BT) resin, DMI-3005, or DMI-3006.

* * * * *